United States Patent
Wu et al.

(10) Patent No.: US 9,324,789 B1
(45) Date of Patent: Apr. 26, 2016

(54) MEMORY DEVICE AND METHOD FOR FABRICATING THE SAME

(71) Applicant: MACRONIX International Co., Ltd., Hsinchu (TW)

(72) Inventors: Guan-Wei Wu, Hsinchu (TW); Yao-Wen Chang, Hsinchu (TW); I-Chen Yang, Hsinchu (TW); Tao-Cheng Lu, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 0 days.

(21) Appl. No.: 14/723,094

(22) Filed: May 27, 2015

(51) Int. Cl.
| | |
|---|---|
| *H01L 29/788* | (2006.01) |
| *H01L 29/06* | (2006.01) |
| *H01L 27/115* | (2006.01) |
| *H01L 21/764* | (2006.01) |
| *H01L 23/528* | (2006.01) |
| *H01L 23/532* | (2006.01) |

(52) U.S. Cl.
CPC .......... *H01L 29/0649* (2013.01); *H01L 21/764* (2013.01); *H01L 23/528* (2013.01); *H01L 23/53271* (2013.01); *H01L 27/11568* (2013.01)

(58) Field of Classification Search
CPC ..................... H01L 29/0649; H01L 27/11568; H01L 23/528; H01L 23/53271
See application file for complete search history.

(56) References Cited

U.S. PATENT DOCUMENTS

| | | | | |
|---|---|---|---|---|
| 2006/0186446 | A1* | 8/2006 | Kim | ..................... H01L 27/115 257/296 |
| 2009/0184360 | A1* | 7/2009 | Jin | ..................... H01L 21/28273 257/319 |
| 2010/0207194 | A1* | 8/2010 | Tanaka | ..................... H01L 27/11578 257/324 |
| 2012/0068253 | A1* | 3/2012 | Oota | ..................... H01L 27/11578 257/324 |
| 2012/0146122 | A1* | 6/2012 | Whang | ..................... H01L 29/7889 257/315 |
| 2013/0032873 | A1* | 2/2013 | Kiyotoshi | ..................... H01L 27/11582 257/324 |
| 2015/0357341 | A1* | 12/2015 | Yeh | ..................... H01L 29/401 257/324 |

FOREIGN PATENT DOCUMENTS

JP         2010171185      * 8/2010

* cited by examiner

*Primary Examiner* — Minh-Loan Tran
*Assistant Examiner* — Farid Khan
(74) *Attorney, Agent, or Firm* — J.C. Patents

(57) ABSTRACT

The memory device is provided to include a substrate, a plurality of stack structures, conductive pillars, charge storage layers, and third conductive layers. The stack structures are arranged along a first direction and extend along a second direction, wherein each stack structure includes a plurality of first conductive layers and a plurality of dielectric layers that are alternately stacked along a third direction. Each conductive pillar is located on the substrate between two adjacent stack structures. Each charge storage layer is disposed between the stack structures and the conductive pillars. Each third conductive layer extending along the first direction overlaps the stack structures in a plurality of overlapped regions and covers a portion of top parts of the stack structures and the conductive pillars. An air gap is formed along the third direction in each overlapped region where the stacked structures and the third conductive layers overlap.

19 Claims, 9 Drawing Sheets

MEMORY DEVICE AND METHOD FOR FABRICATING THE SAME

BACKGROUND OF THE INVENTION

1. Field of the Invention

The invention relates to a semiconductor device and a method for fabricating the same, and particularly relates to a memory device and a method for fabricating the same.

2. Description of Related Art

As science and technology advance, the improvement of electronic devices increases the demands for a greater storage capability. To increase the storage capability, memory devices become smaller, and the integrity thereof becomes higher. Thus, three-dimensional memory devices are receiving more and more attention from the industries.

However, as the size of the memory devices becomes smaller and the integrity thereof becomes higher, a capacitance effect between the word line and the bit line also becomes significant, and the program disturbance caused by the capacitance effect may influence the performance of a memory cell or a memory cell array. Thus, how to reduce the capacitance effect between the word line and the bit line to prevent the disturbance caused by the effect is certainly an issue to be worked on.

SUMMARY OF THE INVENTION

The invention provides a memory device and a method for fabricating the same capable of reducing a capacitance effect between a word line and a bit line, so as to prevent a disturbance caused by the capacitance effect.

The invention provides a memory device. The memory device includes a substrate, a plurality of stack structures, a plurality of conductive pillars, a plurality of charge storage layers, and a plurality of third conductive layers. The stack structures are located on a substrate, arranged along a first direction, and extend along a second direction. In addition, each of the stack structures includes a plurality of first conductive layers and a plurality of dielectric layers that are alternately stacked along a third direction. Each of the conductive pillars is located on the substrate between two adjacent stack structures. Each of the charge storage layers is located between the stack structures and the conductive pillars. Each of the third conductive layers extends along the first direction, overlaps the stack structures at a plurality of overlapped regions, and covers a portion of top parts of the stack structures and the conductive pillars. Each of the overlapped regions where the stack structures and the third conductive layers overlap has an air gap, and the air gap extends along the third direction.

According to an embodiment of the invention, each of the air gaps extends along the third direction and has a plurality of wide portions and a plurality of narrow portions that are alternately arranged.

According to an embodiment of the invention, the wide portions are located in the dielectric layers and the narrow portions are located in the first conductive layers.

According to an embodiment of the invention, shapes of the wide portions include a circular shape, an elliptical shape, a rectangular shape, an elongated rectangular shape, or a combination thereof.

According to an embodiment of the invention, materials of the conductive pillars, the first conductive layers, and the third conductive layers respectively include polysilicon, doped polysilicon, or a combination thereof.

According to an embodiment of the invention, the first conductive layers serve as bit lines and the conductive pillars and the third conductive layers serve as word lines.

According to an embodiment of the invention, the first conductive layers serve as word lines and the conductive pillars and the third conductive layers serve as bit lines.

The invention provides another memory device. The memory device includes a substrate, a plurality of stack layers, a plurality of conductive pillars, a plurality of charge storage layers, and a plurality of third conductive layers. The stack layers are located on a substrate, arranged along a first direction, and extend along a second direction. In addition, each of the stack layers includes a plurality of first conductive layers stacked along a third direction and separated with an interval. Each of the conductive pillars is located on the substrate between two adjacent stack layers. Each of the charge storage layers is located between the stack layers and the conductive pillars. Each of the third conductive layers extends along the first direction, overlaps the stack structures at a plurality of overlapped regions, and covers a portion of top parts of the stack layers and the conductive pillars. Each of the overlapped regions where the stack layers and the third conductive layers overlap has an air gap, the air gap extends along the third direction, and each of the air gaps has a plurality of wide portions and a plurality of narrow portions that are connected to each other and arranged along the third direction. Moreover, each of the narrow portions is located in the first conductive layers, and each of the wide portions is located between two adjacent first conductive layers and exposes a portion of sidewalls of the two adjacent first conductive layers and a sidewall of the charge storage layer between the two adjacent first conductive layers.

According to an embodiment of the invention, shapes of the wide portions include a circular shape, an elliptical shape, a rectangular shape, an elongated rectangular shape, or a combination thereof.

According to an embodiment of the invention, materials of the conductive pillars, the first conductive layers, and the third conductive layers respectively include polysilicon, doped polysilicon, or a combination thereof.

According to an embodiment of the invention, the first conductive layers serve as bit lines and the conductive pillars and the third conductive layers serve as word lines.

According to an embodiment of the invention, the first conductive layers serve as word lines and the conductive pillars and the third conductive layers serve as bit lines.

The invention provides a method for fabricating a memory device, including steps as follows. A plurality of stack structures are formed on a substrate. In addition, the stack structures are arranged along a first direction and extend along a second direction, and each of the stack structures includes a plurality of first conductive layers and a plurality of dielectric layers that are alternately stacked along a third direction. A plurality of conductive pillars are formed on the substrate between two adjacent stack structures. A plurality of charge storage layers are formed between the stack structures and the conductive pillars. A plurality of third conductive layers are formed. Each of the third conductive layers extends along the first direction, overlaps the stack structures at a plurality of overlapped regions, and covers a portion of top parts of the stack structures and the conductive pillars. In addition, the third conductive layer at each of the overlapped regions has an opening. A portion of the stack structures below each of the openings is removed, so as to form an air gap in each of the overlapped regions where the stack structures and the third conductive layers overlap.

Each of the air gaps extends along the third direction.

According to an embodiment of the invention, each of the air gaps extends along the third direction and has a plurality of wide portions and a plurality of narrow portions that are alternately arranged.

According to an embodiment of the invention, the wide portions are located in the dielectric layers and the narrow portions are located in the first conductive layers.

According to an embodiment of the invention, the method further includes removing the dielectric layers in the stack structures in each of the overlapped regions.

According to an embodiment of the invention, shapes of the wide portions include a circular shape, an elliptical shape, a rectangular shape, an elongated rectangular shape, or a combination thereof.

According to an embodiment of the invention, a process of removing a portion of the stack structures includes performing an isotropic etching process, an anisotropic etching process, or a combination thereof.

According to an embodiment of the invention, materials of the conductive pillars, the first conductive layers, and the third conductive layers respectively include polysilicon, doped polysilicon, or a combination thereof.

Based on above, by forming the air gaps in the stack structure, the invention uses an insulating effect of air to reduce the capacitance effect generated between the conductive layers of the stack structure. In this way, the program disturbance caused by the capacitance effect may be prevented, so as to improve the performance of the memory cell or memory cell array.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
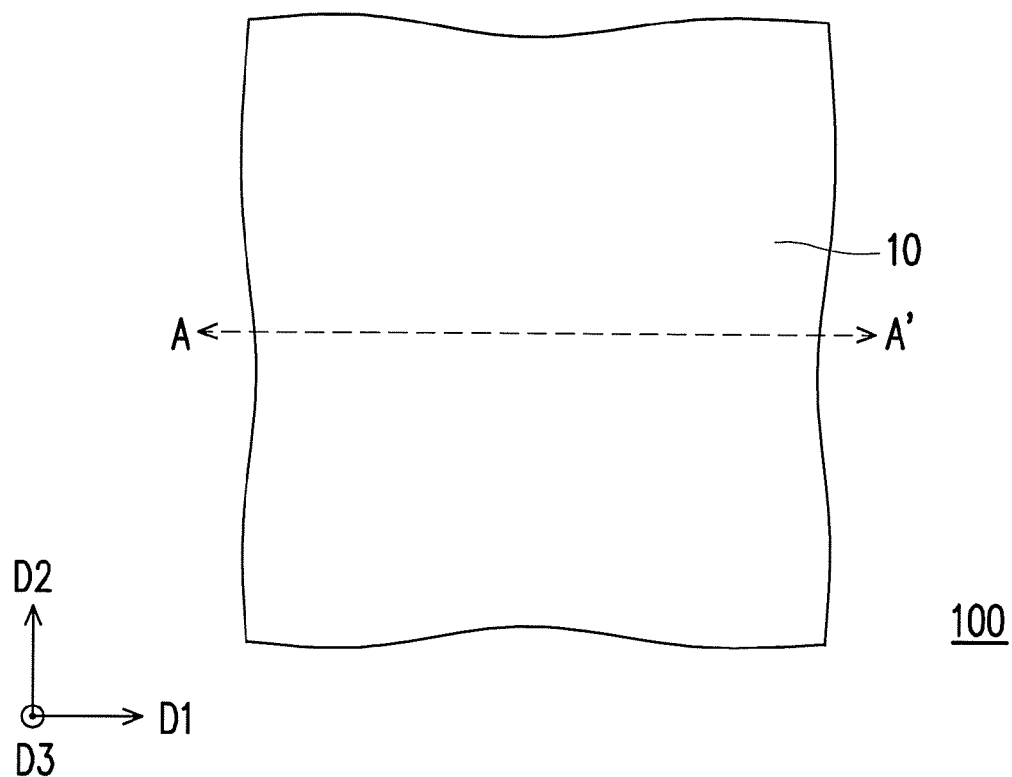
FIGS. 1A to 1G are top views illustrating a method for fabricating a memory device according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

FIGS. 1A to 1G are top views illustrating a method for fabricating a memory device according to an embodiment of the invention. FIGS. 2A to 2G are schematic cross-sectional views illustrating a method for fabricating a memory device taken along line A-A' shown in FIGS. 1A to 1G.

Figure 2A:
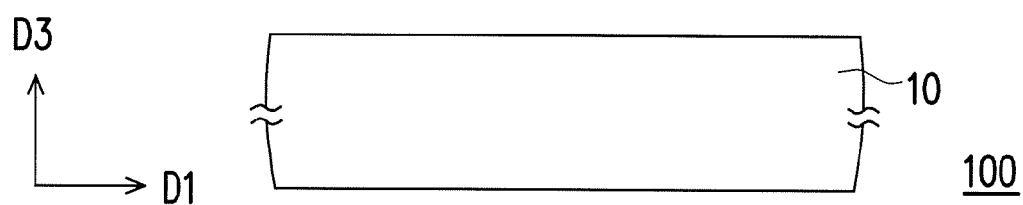
FIGS. 2A to 2G are schematic cross-sectional views illustrating a method for fabricating a memory device taken along line A-A' shown in FIGS. 1A to 1G.

Referring to FIGS. 1A and 2A at the same time, a method for fabricating a memory device 100 is illustrated. First, a substrate 10 is provided. The substrate 10 may include a semiconductor material, an insulating material, a conductive material, or any combination of the aforesaid materials. A material of the substrate 10 may be a material forming of at least one substance selected from a group consisting of Si, Ge, SiGe, GaP, GaAs, SiC, SiGeC, InAs, and InP, for example, or any physical structure suitable for the fabricating process of the invention. The substrate 10 includes a single-layer structure or multi-layer structure. Also, a silicon on insulator (SOI) substrate may be used. The substrate 10 may be formed of silicon or silicon germanium, for example.

Figure 1B:
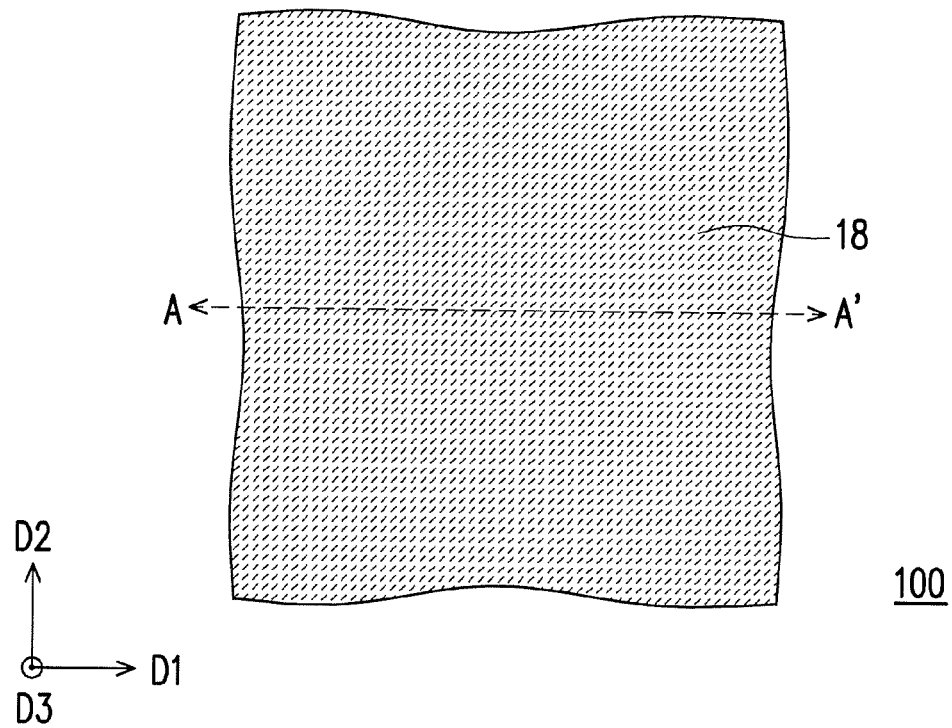
Figure 2B:
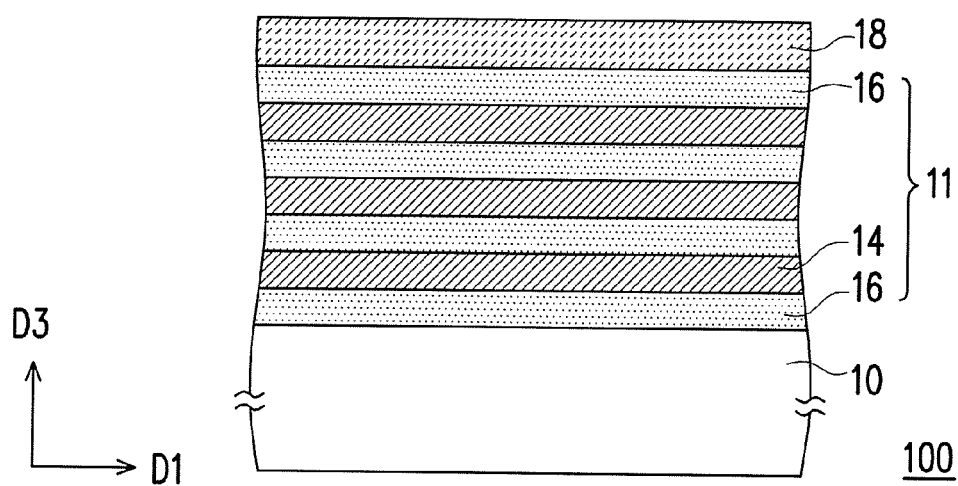

Referring to FIGS. 1B and 2B at the same time, a stack layer 11 is formed on the substrate 10. The stack layer 11 includes a plurality of first conductive layers 14 and a plurality of dielectric layers 16, for example. The stack layer 11 is formed by alternately stacking the first conductive layers 14 and the dielectric layers 16 upward from the substrate 10, for example. In an embodiment, the stack layer 11 formed by stacking 8, 16, 32, or more layers, for example. However, the invention is not limited thereto. A material of the first conductive layer 14 includes undoped semiconductor or doped semiconductor, such as polysilicon or doped polysilicon. A thickness of the first conductive layer 14 is in a range from 100 angstroms to 500 angstroms, for example. A method of forming the first conductive layer 14 includes performing a chemical vapor deposition process. In an embodiment, the first conductive layer 14 serves as a bit line or a word line of the memory device 100, for example. A material of the dielectric layer 16 includes oxide, nitride, oxynitride, or a low dielectric constant material with a dielectric constant lower than 4. A thickness of the dielectric layer 16 ranges from 100 angstroms to 500 angstroms, for example. The dielectric layer 16 is formed, for example, by performing a thermal oxidation or chemical vapor deposition process.

Continuing to refer to FIGS. 1B and 2B, the stack layer 11 may optionally include a hardmask layer 18. The hardmask layer 18 is the uppermost layer of the stack layer 11, for example. However, the invention is not limited thereto. The hardmask layer 18 may be a single layer or multiple layers. A material of the hardmask layer 18 may be silicon oxide, silicon nitride, or other suitable materials, for example. A method of forming the hardmask layer 18 includes performing a chemical vapor deposition process or a metal organic chemical vapor deposition process.

Figure 1C:
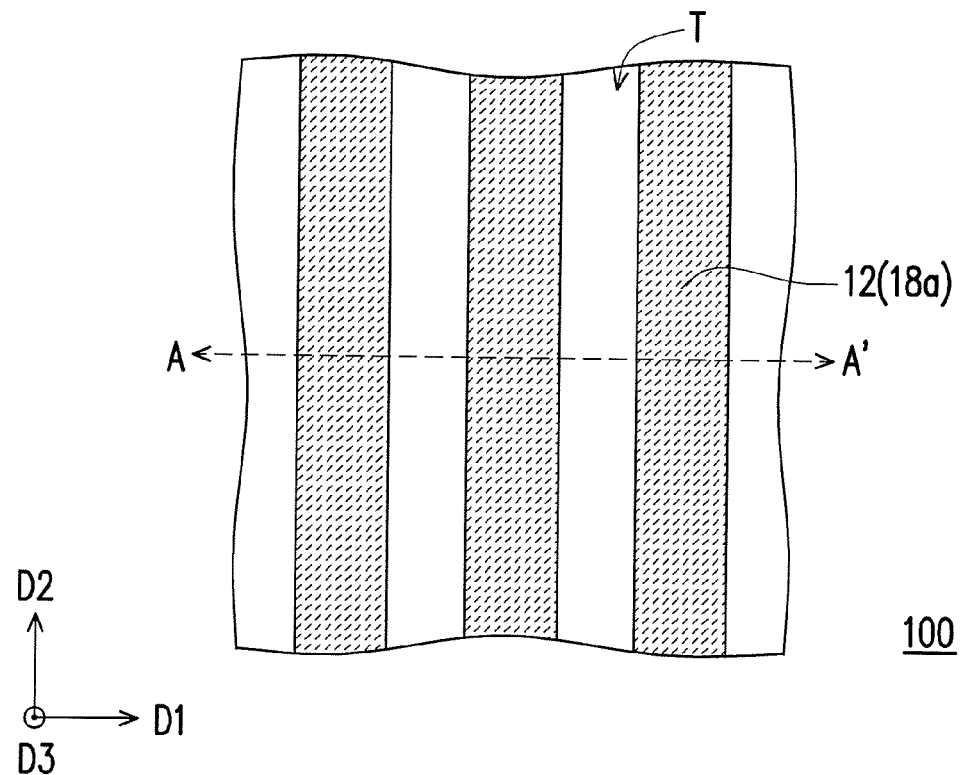
Figure 2C:
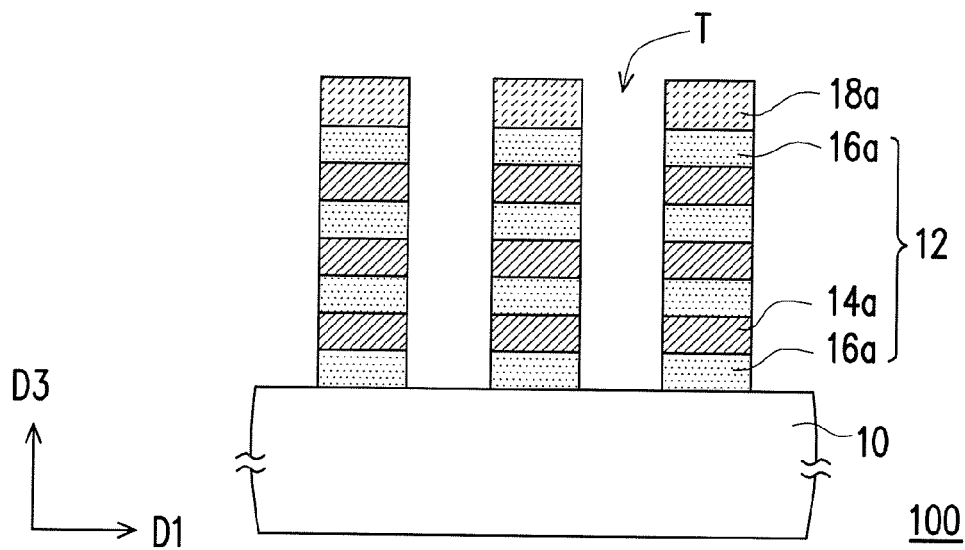

Referring to FIGS. 1C and 2C at the same time, the stack layer 11 is patterned to form a plurality of stack structures 12 arranged along a first direction D1 and extending along a second direction D2. The first direction D1 and the second direction D2 are different, and a trench T extending along the second direction D2 is located between two adjacent stack structures 12. In an embodiment, the first direction D1 and the second direction D2 are substantially perpendicular to each other. In an embodiment, the stack structures 12 include a plurality of patterned first conductive layers 14a and a plurality of patterned dielectric layers 16a, and the patterned first conductive layers 14a and the patterned dielectric layers 16a are stacked alternately along a third direction D3. In another embodiment, the stack structures 12 include the patterned first conductive layers 14a and the patterned dielectric layers 16a alternately stacked along the third direction D3 and patterned hard mask layers 18a located at the uppermost layer of the stack structures 12. The third direction D3 differs from the first direction D1 and the second direction D2. In an embodiment, the third direction D3 and the first direction D1 are substantially perpendicular to each other, and the third direction D3 and the second direction D2 are substantially perpendicular to each other. A method of patterning the stack layer 11 includes performing a photolithography process and an etching process, for example. The etching process is a dry etching process, for example. The dry etching process may be a sputtering etching process, a reactive ion etching process, etc. The trench T may be in an arbitrary shape, such as a V shape, a U shape, a rhombus shape, or a combination thereof.

Figure 1D:
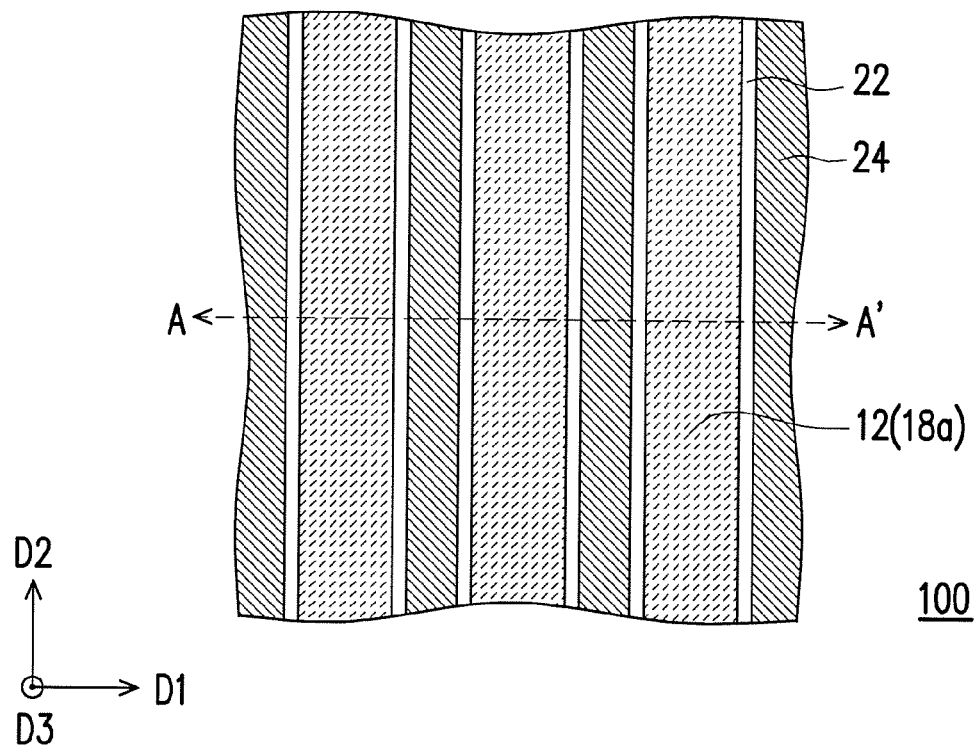
Figure 2D:
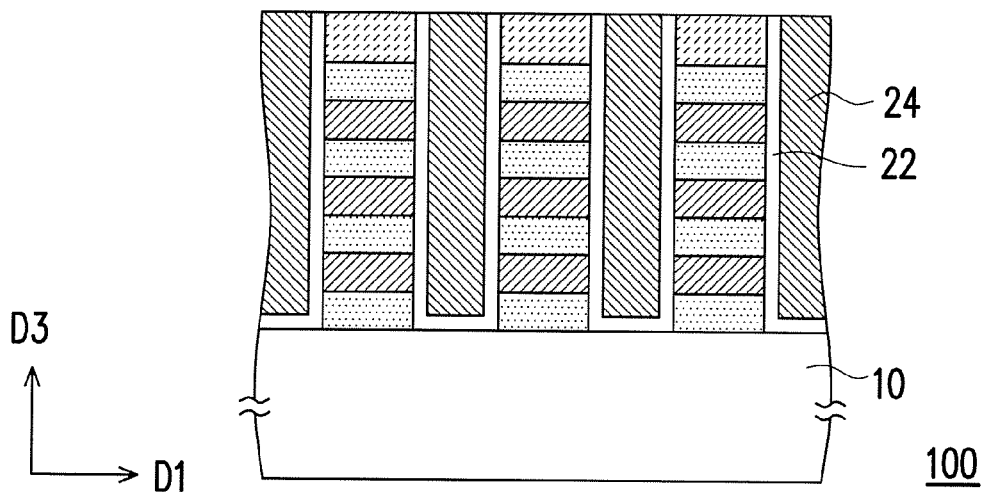

Referring to FIGS. 1D and 2D at the same time, a charge storage layer 22 is formed at a sidewall and a bottom part of the trench T. The charge storage layer 22 is a dielectric layer, for example. The charge storage layer 22 may be a composite layer. For example, the charge storage layer 22 is a composite layer including an oxide layer, a nitride layer, or a combination thereof. More specifically, a material of the charge storage layer 22 includes silicon nitride, silicon oxide, or a combination thereof. In an embodiment, the charge storage layer 22 is a composite layer formed of oxide/nitride/oxide (ONO), for example. A thickness of the charge storage layer 22 is in a range from 100 angstroms to 400 angstroms, for example. However, the invention is not limited thereto. A method of forming the charge storage layer 22 includes performing a thermal oxidation process or a chemical vapor deposition process, for example.

Continuing to refer to FIGS. 1D and 2D, a second conductive layer 24 is formed to fill the trench T. A material of the second conductive layer 24 is polysilicon, doped polysilicon, metal, metal alloy, or a combination thereof, for example. The metal is tungsten, for example. The metal alloy is aluminum-silicon alloy, for example. A method of forming the second conductive layer 24 is performing a chemical vapor deposition process, for example. In an embodiment, a barrier layer may be formed on the sidewall and the bottom part of the trench T before the second conductive layer 24 is formed. A material of the barrier layer includes titanium, titanium nitride, tantalum, tantalum nitride, or a combination thereof, for example. A thickness of the barrier layer is in a range from 10 angstroms to 200 angstroms, for example. A method of forming the barrier layer includes performing a chemical vapor deposition process, for example. However, the invention is not limited thereto.

Before patterning the charge storage layer 22 and the second conductive layer 24, a chemical mechanical polishing (CMP) process may be further performed, so as to remove a portion of the charge storage layer 22 and the second conductive layer 24 and expose the patterned hardmask layer 18a at the uppermost layer of the stack structure 12.

Figure 1E:
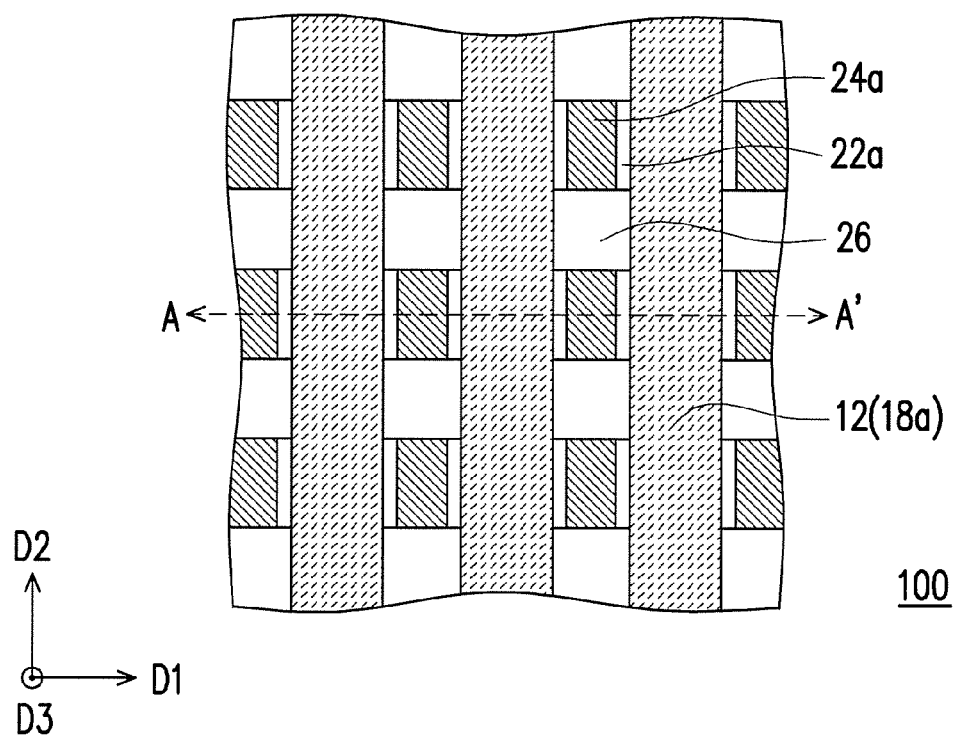
Figure 2E:
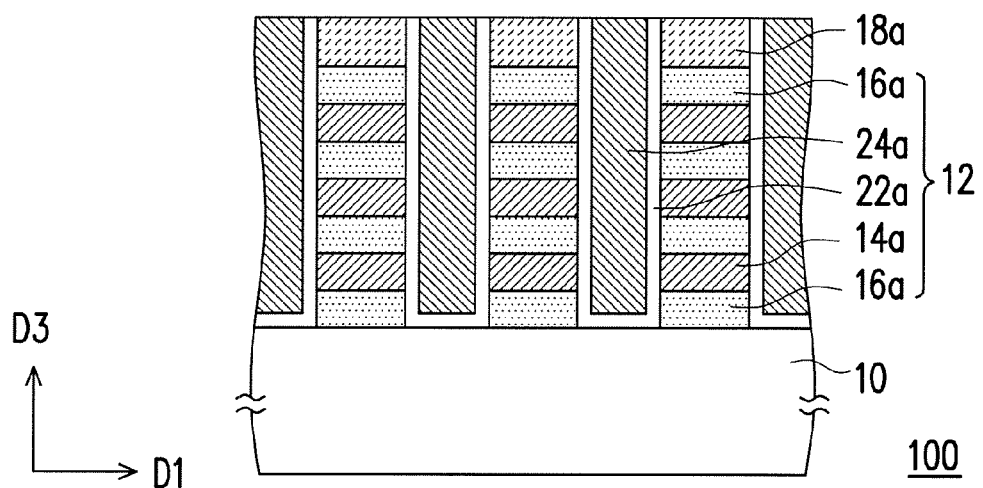

Referring to FIGS. 1E and 2E, the charge storage layer 22 and the second conductive layer 24 are patterned to form a plurality of patterned charge storage layers 22a and a plurality of conductive pillars 24a. A method of patterning the charge storage layer 22 and the second conductive layer 24 includes performing a photolithography process and an etching process, for example. The etching process is a dry etching process, for example. The dry etching process may be a sputtering etching process, a reactive ion etching process, etc. The conductive pillar 24a serves as a word line or a bit line of the memory device, for example.

Continuing to refer to FIGS. 1E and 2E, a dielectric pillar 26 is formed on the substrate between two adjacent conductive pillars 24a. The dielectric pillars 26 extend along the third direction D3, and the conductive pillars 24a and the dielectric pillars 26 are alternately arranged along the second direction D2, so as to electrically isolate the conductive pillars 24a and the stack structures 12. A material of the dielectric pillar 26 includes silicon oxide, silicon nitride, or a combination thereof. A method of forming the dielectric pillar 26 includes filling a dielectric material layer to the substrate 10 in the trench T, and then performing a chemical mechanical polishing process to remove the dielectric material layer on the patterned hardmask layers 18a, the patterned charge storage layers 22a, and the conductive pillars 24a, so as to form the dielectric pillars 26, for example. However, the invention is not limited thereto.

Then, a third conductive layer 34 (not shown) is formed to cover the stack structures 12, the conductive pillars 24a, and the dielectric pillars 26. A material and a forming method of the third conductive layer 34 are the same as those of the second conductive layer 24, and are thus not reiterated in the following.

Figure 1F:
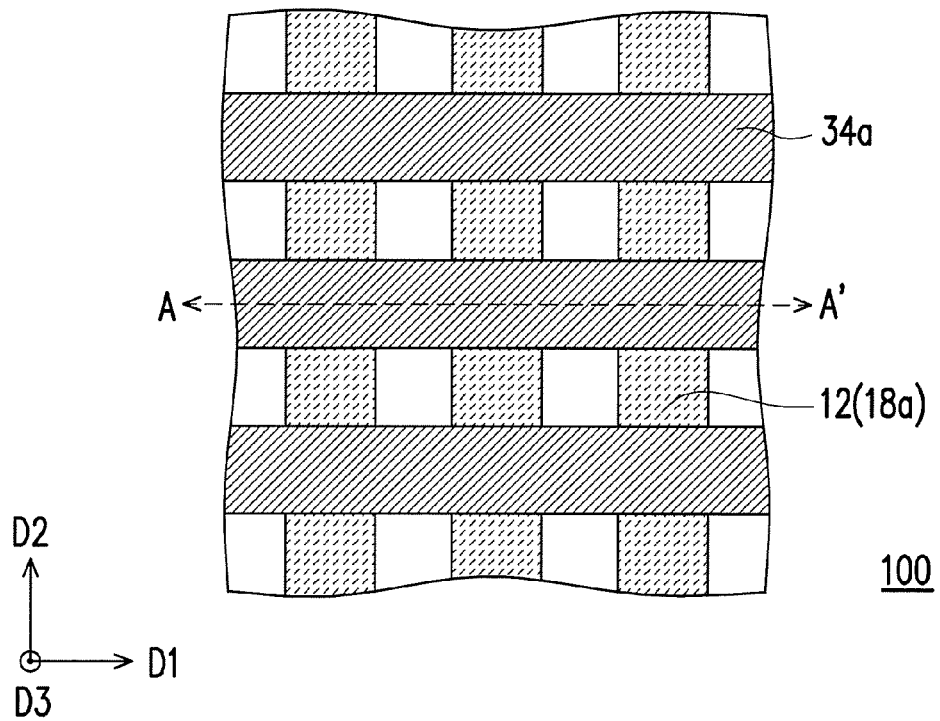
Figure 2F:
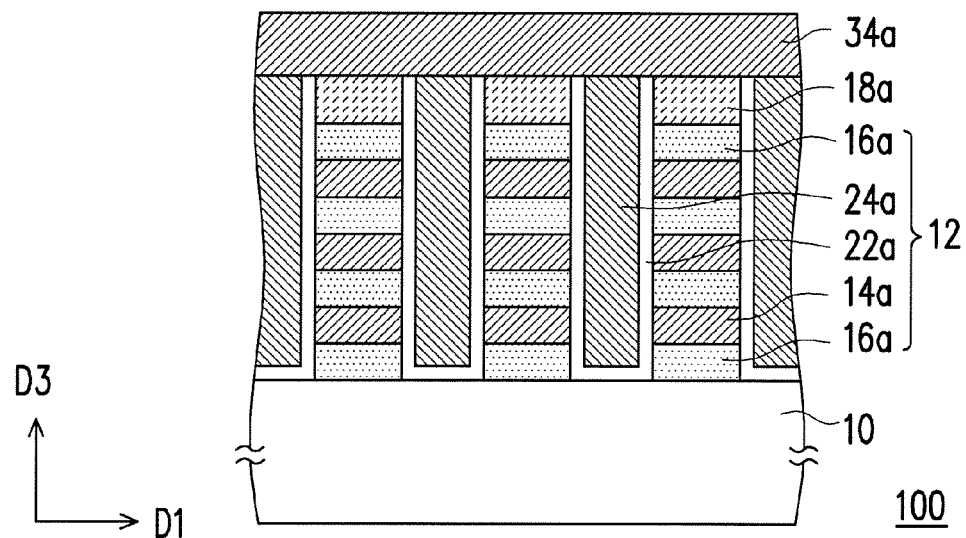

Referring to FIGS. 1F and 2F, the third conductive layer 34 is patterned to remove the third conductive layer 34 covering a portion of the stack structures 12 and the dielectric pillars 26, so as to form patterned third conductive layers 34a. In other words, the patterned third conductive layers 34a extend along the first direction D1 and cover a portion of top parts of the stack structures 12 and the conductive pillars 24a. In addition, the patterned third conductive layers 34a and the stack structures 12 overlap at overlapped regions R. A method of patterning the third conductive layer 34 includes performing a photolithography process and an etching process, for example. The etching process is a dry etching process, for example. The dry etching process may be a sputtering etching process, a reactive ion etching process, etc. In an embodiment, the patterned third conductive layer 34a may serve as a bit line or a word line of the memory device 100, for example.

In a specific embodiment, the conductive pillars 24a and the patterned third conductive layer 34a serve as word lines of the memory device, and the patterned first conductive layers 14a in the stack structures 12 serve as bit lines of the memory device. In another specific embodiment, the conductive pillar 24a and the patterned third conductive layer 34a serve as bit lines of the memory device, and the patterned first conductive layers 14a in the stack structures 12 serve as word lines of the memory device. However, the invention is not limited thereto.

Figure 1G:
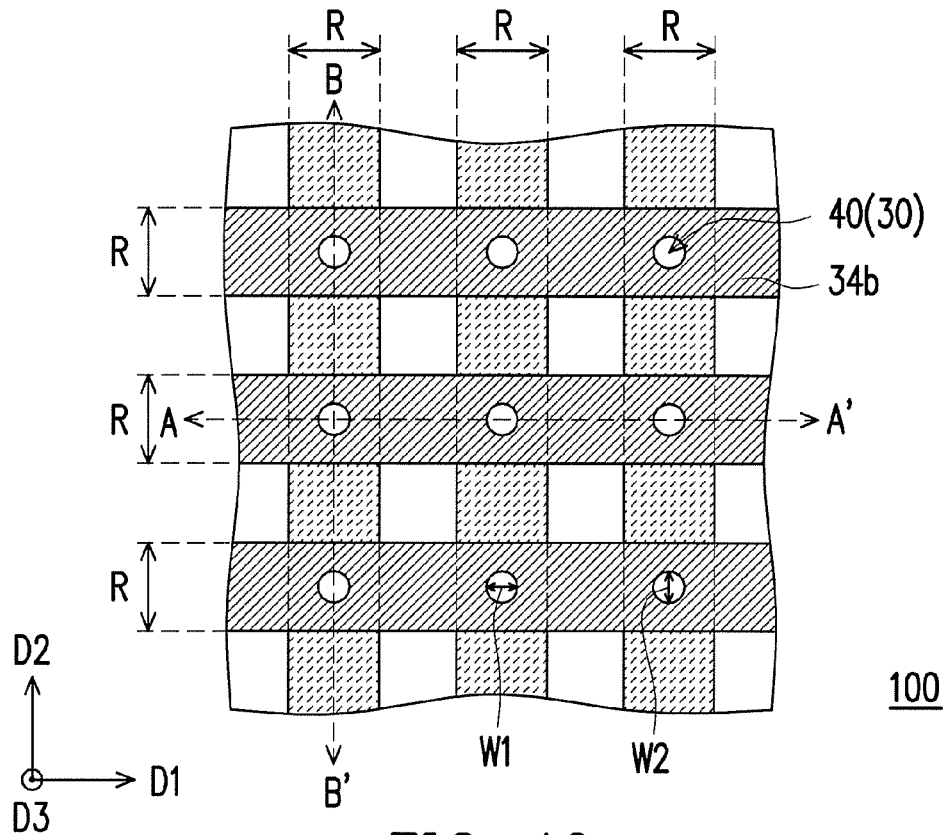
Figure 2G:
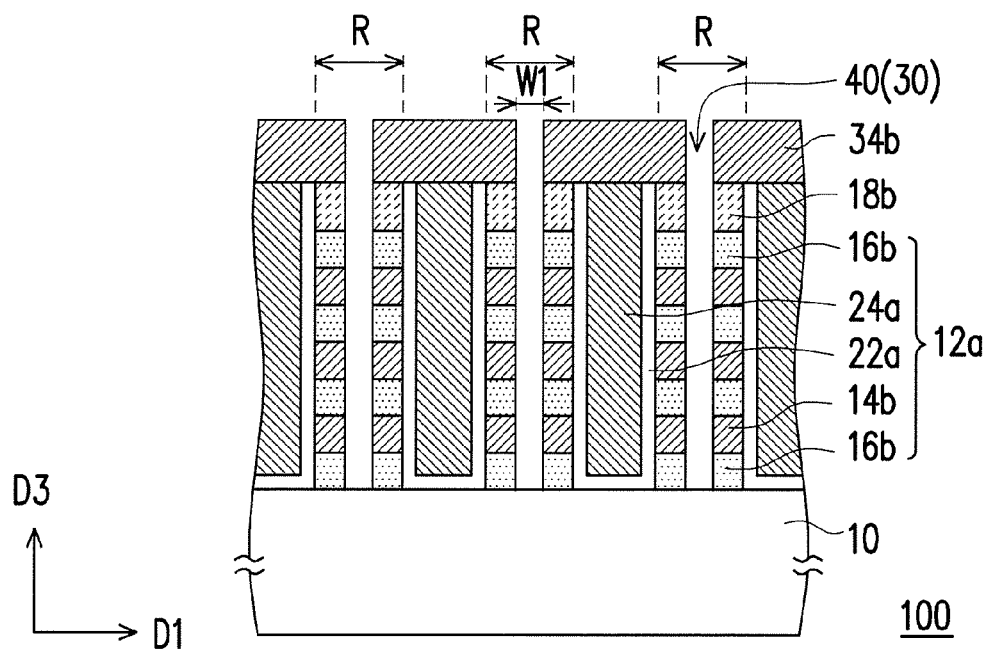

Referring to FIGS. 1G and 2G at the same time, a photolithography process and an etching process are performed to the overlapped regions R where the patterned third conductive layers 34a and the stack structures 12 overlap, so as to form a plurality of air gaps 40 in the overlapped regions R. More specifically, the patterned third conductive layer 34a in each of the overlapped regions R has an opening 30. A portion of the stack structure 12 below each opening 30 is removed to form an air gap 40. The air gap 40 extends along the third direction D3. In other words, in the overlapped region R, the air gap 40 penetrates the patterned third conductive layer 34b and the patterned stack structure 12a along the third direction D3. In an embodiment, the air cap 40 is pillar-like, such as being cuboid, cylindrical, or elliptically cylindrical, for example. A width w1 of the air gap 40 along the first direction D1 is in a range from 100 angstroms to 300 angstroms, for example, a width w2 of the air gap 40 along the second direction D2 is in a range from 100 angstroms to 300 angstroms, for example. An etching method to form the air gap 40 includes performing an isotropic etching process, an anisotropic etching process or a combination thereof. In an embodiment, an etching method to form the air gap 40 includes performing an anisotropic etching process, such as a dry etching process. The dry etching process may be a plasma etching process. In another embodiment, the etching method to form the air gap 40 includes performing an isotropic etching process, such as a wet etching process, for example. The wet etching process includes performing etching using hydrofluoric acid (HF) or buffered oxide etchant, for example. However, the invention is not limited thereto.

Figure 3A:
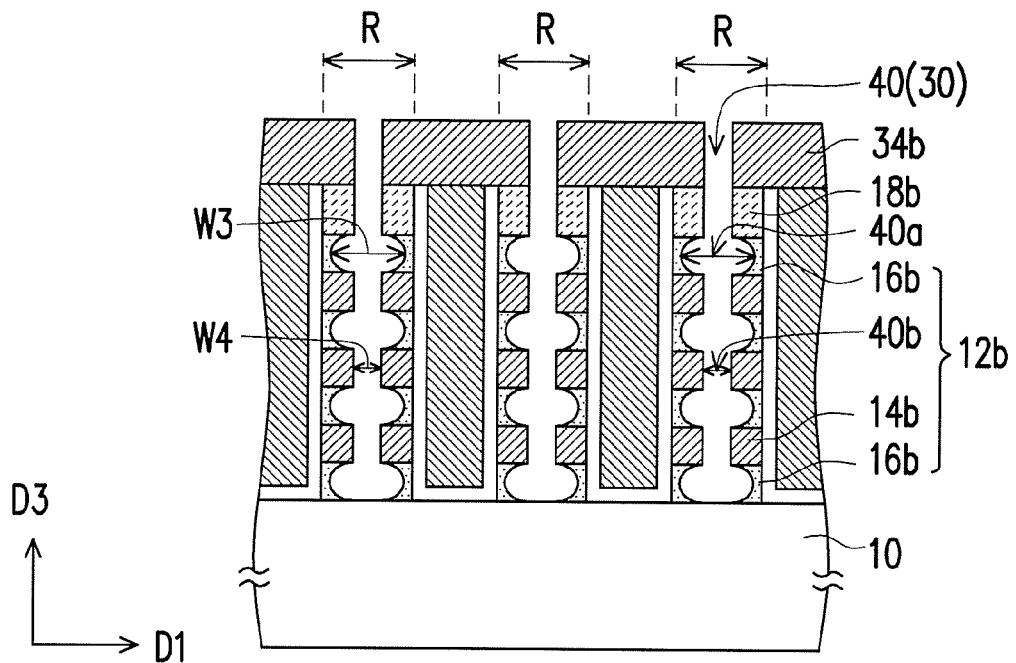
FIGS. 3A and 3B are schematic cross-sectional views respectively illustrating a memory device according to another embodiment of the invention that are taken along lines A-A' and B-B' shown in FIG. 1G.
Figure 3B:
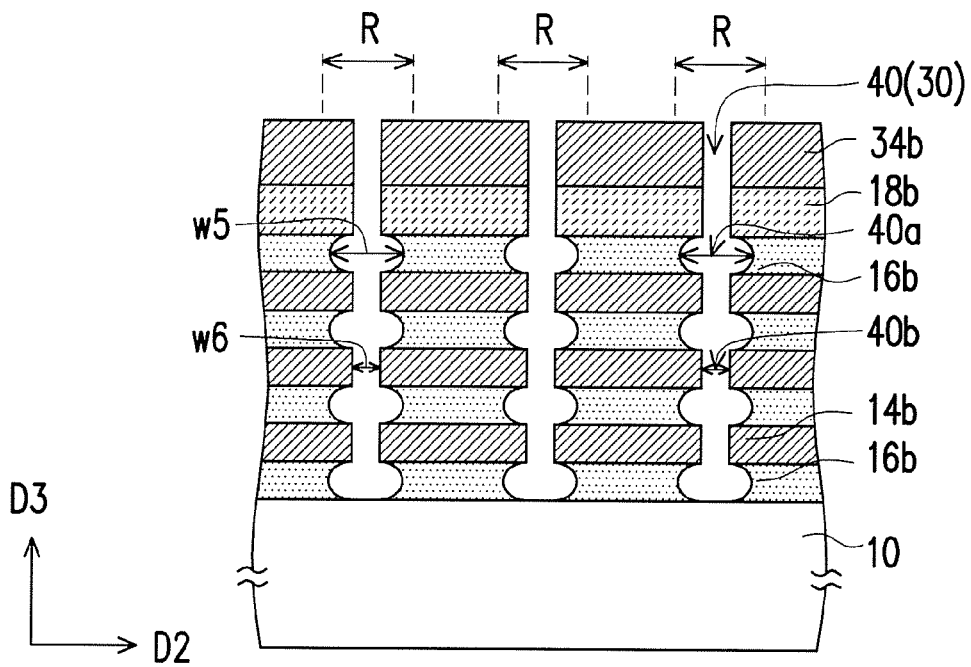

FIGS. 3A and 3B are schematic cross-sectional views respectively illustrating a memory device according to another embodiment of the invention that are taken along lines A-A' and B-B' shown in FIG. 1G.

Referring to FIGS. 3A and 3B, in another embodiment, since the patterned dielectric layers 16a have a high etching selectivity ratio with respect to the patterned first conductive layers 14a in the patterned stack structures 12a, in the overlapped regions R after the photolithography process and the etching process, greater air gaps (wide portions) 40a may be formed in patterned dielectric layers 16b and smaller air gaps 40b (narrow portions) may be formed in patterned first conductive layers 14b. More specifically, the air gaps 40 extend along the third direction D3 and have the wide portions 40a and the narrow portions 40b that are alternately arranged. In a specific embodiment, the wide portions 40a are located in the patterned dielectric layer 16b, the narrow portions 40b are located in the patterned first conductive layer 14b, and the wide portions 40a and the narrow portion 40b are alternately arranged along the third direction D3. For example, a maximum width w3 of the wide portion 40a along the first direction D1 is in a range from 300 angstroms to 500 angstroms, and a maximum width w4 of the narrow portion 40b along the first direction D1 is in a range from 200 angstroms to 400 angstroms. In another embodiment, a maximum width w5 of the wide portion 40a in the second direction D2 is in a range from 300 angstroms to 500 angstroms, and a maximum width w6 of the narrow portion 40b in the second direction D2 is in a range from 200 angstroms to 400 angstroms. A shape of the wide portion 40a includes a circular shape, an elliptical shape, a rectangular shape, an elongated rectangular shape, or a combination thereof, for example.

Figure 4:
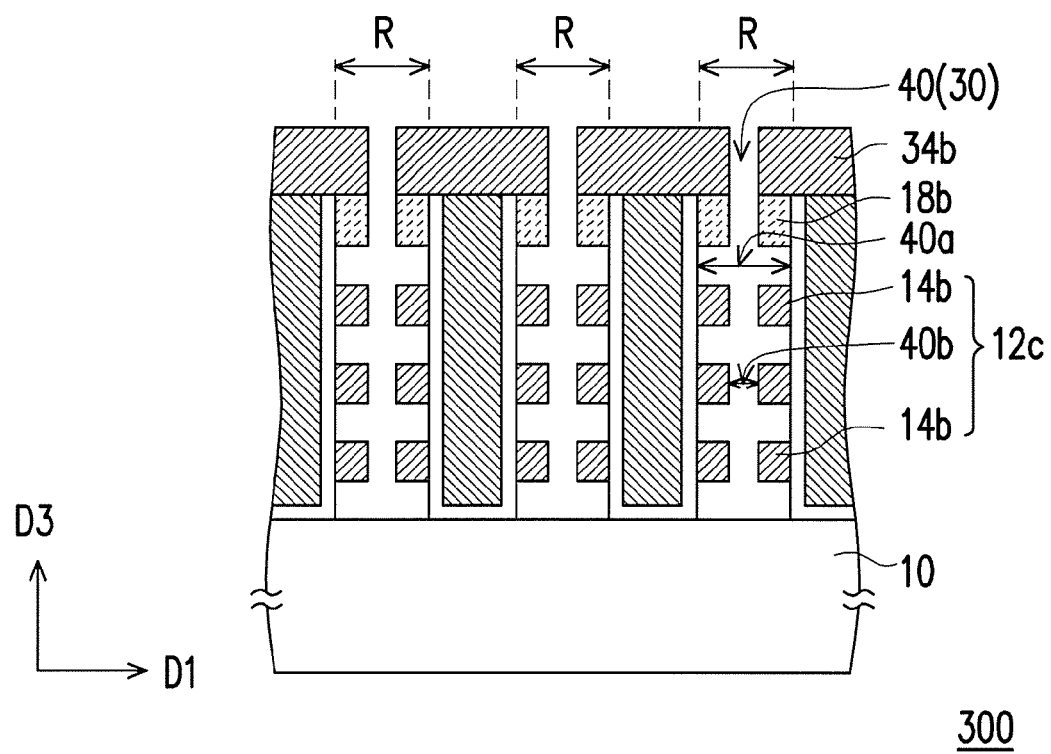
FIG. 4 is a schematic cross-sectional view illustrating a memory device according to yet another embodiment of the invention that is taken along line A-A' shown in FIG. 1F.

FIG. 4 is a schematic cross-sectional view illustrating a memory device according to yet another embodiment of the invention that is taken along line A-A' shown in FIG. 1F.

Referring to FIG. 4, in another embodiment, since the patterned dielectric layer 16a has a high etching selectivity ratio with respect to the patterned first conductive layer 14a in the patterned stack structure 12a, after the etching process for forming the air gap is performed, the patterned dielectric layer 14a in the overlapped region R may be completely removed through etching. In other words, in this embodiment, a patterned stack structure 12c in the overlapped region R includes the first conductive layers 14b that are stacked with separation of an interval along the third direction D3. The wide portion 40a of the air gap 40 is located between two adjacent patterned first conductive layers 14b. More specifically, in this embodiment, the patterned stack structure 12c at the overlapped region R is formed of the patterned first conductive layers 14b. The wide portion 40a of the air gap 40 is located between two adjacent patterned first conductive layers 14b. The patterned stack structure 12c in the third direction D3 is formed of the patterned first conductive layers 14b and the wide portions 40a of the air gaps 40 that are alternately arranged. In other words, as the patterned dielectric layer 16a does not exist, the wide portion 40a of the air gap 40 exposes a portion of sidewalls of two adjacent patterned first conductive layers 14b and a sidewall of the patterned charge storage layer 22a between the two adjacent patterned first conductive layers 14b.

It should be noted that since the dielectric constant of air is close to 1, air has a preferable insulating property. Thus, the air gap in the patterned dielectric layer or the wide portion of the air gap that replaces the patterned dielectric layer may reduce a capacitance effect between two adjacent first conductive layers and between the first conductive layer and the conductive pillar, so as to reduce program disturbance caused by the capacitance effect and improve the performance of a memory cell or a memory cell array.

In the following the structure of the memory device of the invention is described with reference to FIGS. 1G and 2G. As shown in FIGS. 1G and 2G, the memory device 100 of the invention includes the substrate 10, the patterned stack structures 12a, the conductive pillars 24a, the patterned charge storage layers 22a, and the patterned third conductive layers 34b. The stack structures 12a are located on the substrate 10, arranged along the first direction D1, and extend along the second direction D2. In addition, the stack structure 12a includes the patterned first conductive layers 14b and the patterned dielectric layers 16b alternately stacked along the third direction D3. The conductive pillar 24a is located on the substrate 10 between two adjacent stack structures 12a. Each of the charge storage layers 22a is located between the stack structure 12a and the conductive pillar 24a. Each of the third conductive layers 34b extends along the first direction D1, overlaps the stack structures 12a at the overlapped regions R, and covers a portion of the top parts of the stack structures 12a and the conductive pillars 24a. Each of the overlapped regions R where the stack structures 12a and the third conductive layer 34b overlap has the air gap 40, and the air gap 40 extends along the third direction D3.

In an embodiment, the memory device 100 of the invention is as shown in FIG. 2G, where the air gap 40 is cylindrical. However, the invention is not limited thereto. The air gap 40 penetrates the third conductive layer 34b, the hardmask layer 18a, and the stack structure 12b along the third direction D3. Details concerning the shape, width and forming method of the air gap 40 are already described above, and thus not reiterated in the following.

In another embodiment, a memory device 200 of the invention is as shown in FIG. 3A. In the memory device 200, each of the air gaps 40 has the wide portions 40a and the narrow portions 40b that extend along the third direction D3 and are alternately arranged. More specifically, the wide portions 40a are located in the dielectric layers 16b, and the narrow portions 40b are located in the first conductive layers 14b. However, the invention is not limited thereto. Details concerning the shape, width and forming method of the wide portion 40a are already described above, and thus not reiterated in the following.

In yet another embodiment, a memory device 300 of the invention is as shown in FIG. 4. The embodiment differs from the embodiment shown in FIG. 3A in that the patterned dielectric layers 16b in the overlapped regions R are completely removed through etching. In other words, in the stack structures 12c at the overlapped regions R, the first conductive layers 14b extend along the third direction D3 and the wide portion 40a of the air gap 40 is located between two adjacent first conductive layers 14b. The dielectric layer 16b does not exist. However, the invention is not limited thereto. Details concerning the shape, width and forming method of the wide portion 40a are already described above, and thus not reiterated in the following. The air gap 40 exposes a portion of the sidewalls of two adjacent first conductive layers 14b and the sidewall of the charge storage layer 22a between two adjacent first conductive layers 14b.

The memory device of the invention and the method for fabricating the same may be adapted for 3D vertical gate memory cells or other 3D non-volatile memory device. However, the invention is not limited thereto.

In view of the foregoing, the air gap is formed in the stack structure of the invention. Since the dielectric constant of air is close to 1, using air as an insulating layer provides a preferable insulating effect. In the invention, the air gap in the cuboid or cylindrical shape can be formed in the stack structure, and the air gap having the wide and narrow portions that are alternately arranged may also be formed in the stack structure by making use the high etching selectivity ratio between the dielectric layer and the conductive layer in the stack structure. Furthermore, the dielectric layer in the stack structure may be completed removed through etching and replaced with the air gap to reach an even more preferable insulating effect. Thus, by forming the air gap in the stack structure, the invention is capable of reducing the capacitance effect between the conductive layers in the stack structure and between the conductive layer in the stack structure and the conductive pillar. In this way, the program disturbance caused by the capacitance effect may be prevented, so as to improve the performance of the memory cell or memory cell array.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A memory device, comprising:
a plurality of stack structures, located on a substrate, wherein the stack structures are arranged along a first direction and extend along a second direction, and each of the stack structures comprises a plurality of first conductive layers and a plurality of dielectric layers that are alternately stacked along a third direction;
a plurality of conductive pillars, wherein each of the conductive pillars is located on the substrate between two adjacent stack structures;
a plurality of charge storage layers, wherein each of the charge storage layers is located between the stack structures and the conductive pillars; and
a plurality of third conductive layers, wherein each of the third conductive layers extends along the first direction, overlaps the stack structures at a plurality of overlapped regions, and covers a portion of top parts of the stack structures and the conductive pillars,
wherein each of the overlapped regions where the stack structures and the third conductive layers overlap has an air gap, and the air gap extends along the third direction.

2. The memory device as claimed in claim 1, wherein each of the air gaps extends along the third direction and has a plurality of wide portions and a plurality of narrow portions that are alternately arranged.

3. The memory device as claimed in claim 2, wherein the wide portions are located in the dielectric layers and the narrow portions are located in the first conductive layers.

4. The memory device as claimed in claim 2, wherein shapes of the wide portions comprise a circular shape, an elliptical shape, a rectangular shape, an elongated rectangular shape, or a combination thereof.

5. The memory device as claimed in claim 1, wherein materials of the conductive pillars, the first conductive layers, and the third conductive layers respectively comprise polysilicon, doped polysilicon, or a combination thereof.

6. The memory device as claimed in claim 1, wherein the first conductive layers serve as bit lines and the conductive pillars and the third conductive layers serve as word lines.

7. The memory device as claimed in claim 1, wherein the first conductive layers serve as word lines and the conductive pillars and the third conductive layers serve as bit lines.

8. A memory device, comprising:
a plurality of stack layers, located on a substrate, wherein the stack layers are arranged along a first direction and extend along a second direction, and each of the stack layers comprises a plurality of first conductive layers stacked along a third direction and separated with an interval;
a plurality of conductive pillars, wherein each of the conductive pillars is located on the substrate between two adjacent stack layers;
a plurality of charge storage layers, wherein each of the charge storage layers is located between the stack layers and the conductive pillars; and
a plurality of third conductive layers, wherein each of the third conductive layers extends along the first direction, overlaps the stack layers at a plurality of overlapped regions, and covers a portion of top parts of the stack layers and the conductive pillars,
wherein each of the overlapped regions where the stack layers and the third conductive layers overlap has an air gap, the air gap extends along the third direction, each of the air gaps has a plurality of wide portions and a plurality of narrow portions that are connected to each other and arranged along the third direction, each of the narrow portions is located in the first conductive layers, and each of the wide portions is located between two adjacent first conductive layers and exposes a portion of sidewalls of the two adjacent first conductive layers and a sidewall of the charge storage layer between the two adjacent first conductive layers.

9. The memory device as claimed in claim 8, wherein shapes of the wide portions comprise a circular shape, an elliptical shape, a rectangular shape, an elongated rectangular shape, or a combination thereof.

10. The memory device as claimed in claim 8, wherein materials of the conductive pillars, the first conductive layers, and the third conductive layers respectively comprise polysilicon, doped polysilicon, or a combination thereof.

11. The memory device as claimed in claim 8, wherein the first conductive layers serve as bit lines and the conductive pillars and the third conductive layers serve as word lines.

12. The memory device as claimed in claim 8, wherein the first conductive layers serve as word lines and the conductive pillars and the third conductive layers serve as bit lines.

13. A method for fabricating a memory device, comprising:
forming a plurality of stack structures on a substrate, wherein the stack structures are arranged along a first direction and extend along a second direction, wherein each of the stack structures comprises a plurality of first conductive layers and a plurality of dielectric layers that are alternately stacked along a third direction;
forming a plurality of conductive pillars on the substrate between two adjacent stack structures;
forming a plurality of charge storage layers between the stack structures and the conductive pillars;
forming a plurality of third conductive layers, wherein each of the third conductive layers extends along the first direction, overlaps the stack structures at a plurality of overlapped regions, and covers a portion of top parts of the stack structures and the conductive pillars, wherein the third conductive layer at each of the overlapped regions has an opening; and
removing a portion of the stack structures below each of the openings, so as to form an air gap in each of the overlapped regions where the stack structures and the third conductive layers overlap, wherein each of the air gaps extends along the third direction.

14. The fabricating method for the memory device as claimed in claim 13, wherein each of the air gaps extends along the third direction and has a plurality of wide portions and a plurality of narrow portions that are alternately arranged.

15. The fabricating method for the memory device as claimed in claim 14, wherein the wide portions are located in the dielectric layers and the narrow portions are located in the first conductive layers.

16. The fabricating method for the memory device as claimed in claim 13, further comprising removing the dielectric layers in the stack structures in each of the overlapped regions.

17. The fabricating method for the memory device as claimed in claim 13, wherein shapes of the wide portions comprise a circular shape, an elliptical shape, a rectangular shape, an elongated rectangular shape, or a combination thereof.

18. The fabricating method for the memory device as claimed in claim 13, wherein a process of removing a portion of the stack structures comprises performing an isotropic etching process, an anisotropic etching process, or a combination thereof.

19. The fabricating method for the memory device as claimed in claim 13, wherein materials of the conductive pillars, the first conductive layers, and the third conductive layers respectively comprise polysilicon, doped polysilicon, or a combination thereof.

* * * * *